United States Patent [19]

Holden et al.

[11] Patent Number: 5,020,058
[45] Date of Patent: May 28, 1991

[54] PACKET VOICE/DATA COMMUNICATION SYSTEM HAVING PROTOCOL INDEPENDENT REPETITIVE PACKET SUPPRESSION

[75] Inventors: Brian D. Holden, Half Moon Bay; Randall M. Presuhn, Campbell; William L. Robertson, San Jose; Gaymond W. Schultz, Los Altos, all of Calif.

[73] Assignee: Stratacom, Inc., Campbell, Calif.

[21] Appl. No.: 299,404

[22] Filed: Jan. 23, 1989

[51] Int. Cl.$^5$ .......................... H04B 1/66; G04L 3/02
[52] U.S. Cl. ........................ 370/109; 370/94.1; 370/118; 375/122; 358/133; 341/87; 381/29; 381/34; 382/56
[58] Field of Search .................. 370/118, 109, 60, 79, 370/94.1, 95.1; 340/825.5, 825.53; 375/122, 27, 31; 358/133, 135, 136; 381/29, 30, 34; 382/56; 341/60, 87, 51

[56] References Cited

U.S. PATENT DOCUMENTS

| 4,589,110 | 5/1986 | Eng et al. ........................ 370/109 |
| 4,622,585 | 11/1986 | Reitsma .......................... 358/135 |
| 4,633,490 | 12/1986 | Goertzel et al. .................. 358/135 |
| 4,710,810 | 12/1987 | Koga ............................... 358/133 |
| 4,718,059 | 1/1988 | Zwaga et al. .................... 370/95 |
| 4,782,485 | 11/1988 | Gollub ............................ 370/118 |
| 4,799,242 | 1/1989 | Vermeulen ...................... 375/122 |
| 4,802,221 | 1/1989 | Jibbe .............................. 381/30 |
| 4,823,342 | 4/1989 | Morita et al. ................... 370/109 |

FOREIGN PATENT DOCUMENTS 0135033 6/1988 Japan ................................ 370/109

OTHER PUBLICATIONS

C. M. Kortman, "Redundancy Reduction—A Practical Method of Data Compresson", Procedings of the IEEE, vol. 55, No. 3, Mar., 1967.

Primary Examiner—Douglas W. Olms
Assistant Examiner—Alpus H. Hsu
Attorney, Agent, or Firm—Flehr, Hohbach, Test, Albritton & Herbert

[57] ABSTRACT

A data communication system includes a repetitive pattern packet suppression technique which suppresses transmission of entire packets in a data stream when a repeating pattern has been established in the previous packet and then is found to repeat throughout the following packets. An expansion part of the technique fills the resulting hole in the data stream with the last pattern from the previously received packet.

11 Claims, 16 Drawing Sheets

FIG. 1J

REPETITIVE PATTERN
SUPPRESSION (RPS)
EXPANSION
GENERIC
LOGIC DIAGRAM (SHOWN FOR 7 BIT PATTERN)

FIG. 6

RPS IN THE PRESENCE OF DROPPED PACKETS

| | INTO TRANSMITTER | | INTO RECEIVER | | | OUT OF THE RECEIVER | | |
|---|---|---|---|---|---|---|---|---|
| 1 | REPEATING | RANDOM | RANDOM | SUPPRESSED | DROP | RANDOM | PATTERN | PATTERN | RANDOM |
| 2 | REPEATING PATTERN A | RANDOM | REPEATING PATTERN B | SUPPRESSED | DROP | SUPPRESSED | PATTERN | PATTERN A | PATTERN A |
| 3 | RANDOM | RANDOM | RANDOM | RANDOM | DROP | RANDOM | RANDOM | INCORRECT PATTERN | RANDOM |
| 4 | RANDOM | RANDOM | REPEATING | RANDOM | DROP | SUPPRESSED | RANDOM | INCORRECT PATTERN | INCORRECT PATTERN |

RPS IN THE PRESENCE OF ERRORS IN THE LAST SAMPLE PRECEEDING A SUPPRESSED PACKET

| | | | ERROR | | | | |
|---|---|---|---|---|---|---|---|
| 5 | RANDOM | REPEATING | REPEATING | RANDOM | SUPPRESSED | SUPPRESSED | RANDOM | INCORRECT PATTERN | INCORRECT PATTERN |

RPS COMPRESSION EXAMPLE

INCOMING DATA

| 31 | 47 | 39 | 2A | 44 | 78 | 78 | 78 | 78 | 78 | 78 | 78 | 78 | 78 | 78 | 78 | 78 | 78 | 29 | 2C |

IPX PACKET BOUNDARIES

THIS PACKET IS SENT BECAUSE THE DATA IS CHANGING

THIS PACKET IS NOT SENT BECAUSE THE PATTERN, 78, IS REPEATED THROUGHOUT THE PACKET AND IT WAS ALSO PRESENT IN THE LAST TWO SAMPLES OF THE PREVIOUS PACKET.

THIS PACKET IS SENT

PACKETS AT RECEIVER

OUTGOING DATA

| 31 | 47 | 39 | 2A | 44 | 78 | 78 | 78 | 78 | 78 | 78 | 78 | 78 | 78 | 78 | 78 | 78 | 78 | 29 | 2C |

THIS PACKET FILLED IN WITH THE PATTERN FROM THE END OF THE PREVIOUS PACKET AND RECREATES THE INCOMING DATA STREAM.

FIG. 7

PACKET VOICE/DATA COMMUNICATION SYSTEM HAVING PROTOCOL INDEPENDENT REPETITIVE PACKET SUPPRESSION

BACKGROUND OF THE INVENTION

The present invention relates to a data communication system, and more particularly to a data communication system having repetitive packet suppression.

Data compression is a desirable property of data communication systems. Many data communication facilities are only partially used, and sit idle much of the time. In communications systems which utilize what is known as a T1 line, data packets can be transmitted over the T1 line. This provides the best characteristics of traditional packet and circuit switches in a common system.

One such high speed system is manufactured by Stratacom, Inc., providing data communication capabilities for private T1 network applications, and is described in more detail in U.S. Pat. No. 4,771,425, the details of which are hereby incorporated by reference. That high speed system, like traditional packet switches, transmits and switches information in packet format. That system delivers the same benefits users expect from packet switching systems — economical transmission, reliability and sophisticated network routing and management. Like T1 circuit switches, such a system supports high throughput and low delays necessary for voice, video image and high speed data. The result is a very desirable platform for integrating voice, video, low speed data and emerging high speed data applications over digital T1 facilities.

In such a system, it would be highly desirable to provide data compression techniques such that packets containing redundant information are not transmitted across the network. Such a desirable capability would use minimal bandwidth when the incoming data pattern on the line is not changing, thus saving valuable bandwidth and in turn reducing the cost of transmission.

SUMMARY OF THE INVENTION

It is an object of the present invention to provide an improved data communication system that utilizes bandwidth more efficiently.

It is a more particular object of the present invention to provide a data communication system which utilizes repetitive packet suppression.

The repetitive pattern suppression (RPS) technique according to the present invention is a protocol independent algorithm for data compression which is implemented in a data communication system. One feature of the repetitive pattern suppression technique is to use minimal bandwidth when the incoming data pattern is not changing, analogous to the way that a Voice Data Processor (VDP card of IPX system) does not send voice packets when the speaker is silent (the incoming voice signal consists of silence).

The repetitive pattern suppression technique utilizes a compression/expansion algorithm. On the compression side, the repetitive pattern suppression (RPS) technique looks for repeating patterns in an incoming data stream. The RPS compression side suppresses the transmission of entire packets when a repeating pattern has been established in the last sample of the previous packet, and then is found to repeat throughout the current packet.

Whenever a packet does not arrive in time to be played out to the user, the expansion part of the RPS algorithm fills (replicates) the resulting hole in the data stream with the last sample from the previously received packet.

The number of bits used to declare a pattern match is user configurable. Either a 7- or 8-bit pattern can be defined on a per port basis. The default value is 8 bits. Further details on selecting a pattern size for different protocols are described below.

Sequence numbers are contained in each RPS packet to maintain a fixed data delay through the network. They are also used by the receiver to detect missing packets.

Other objects, features and advantages of the present invention will become apparent from the following detailed description when taken in conjunction with the accompanying drawings.

BRIEF DESCRIPTION OF THE DRAWINGS

Figure 1J:
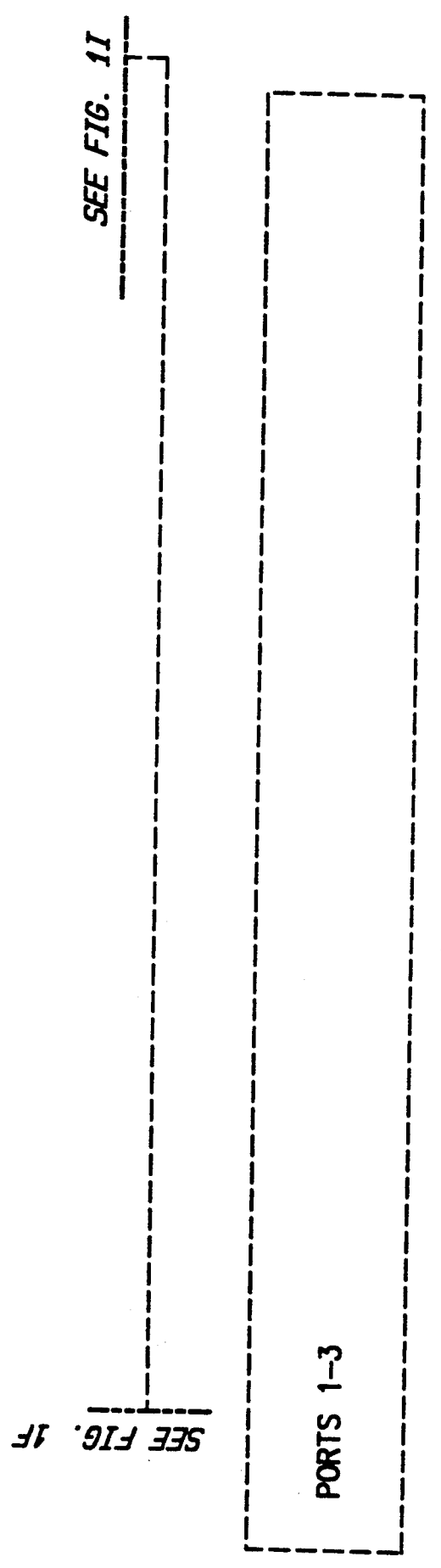

FIG. 1A-1J depict a block diagram of a data communication system which incorporates a repetitive pattern packet suppression technique according to the present invention.

FIG. 6 depicts a diagram illustrating RPS technique in the presence of dropped packets according to the present invention.

FIG. 7 depicts a diagram illustrating the RPS technique according to the present invention.

DETAILED DESCRIPTION OF THE DRAWINGS

RPS Operation

Figure 1A:
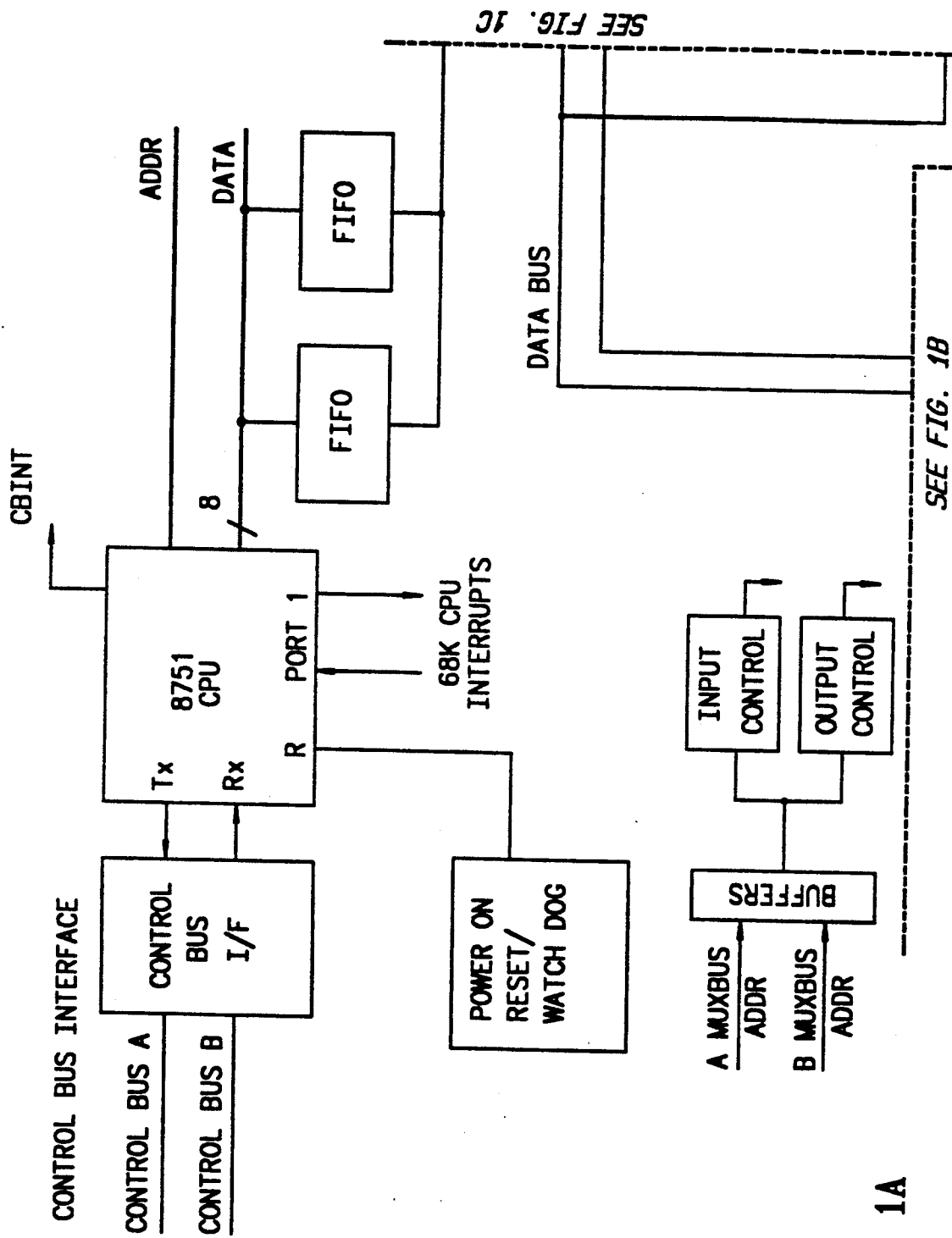
Figure 1B:
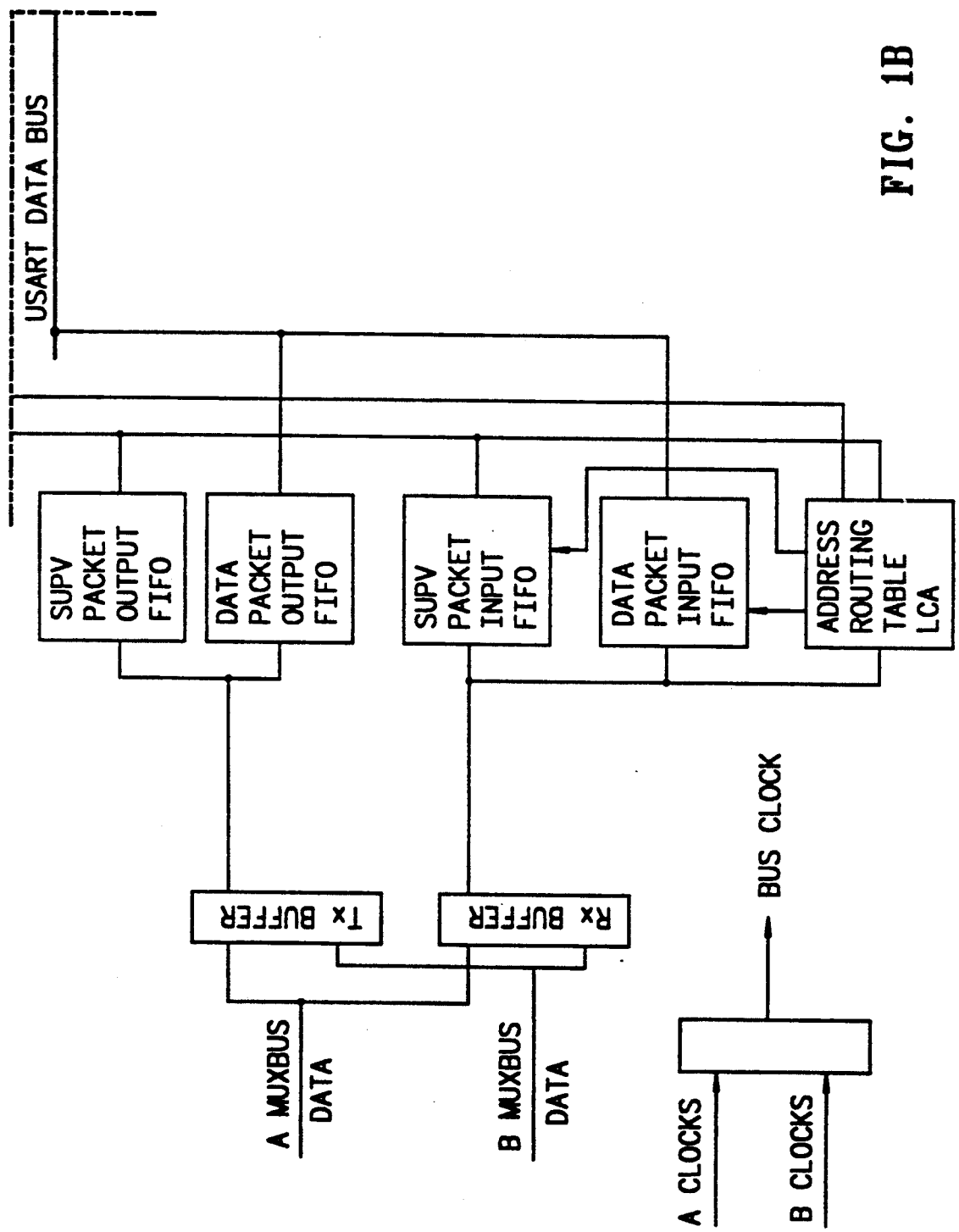
Figure 1C:
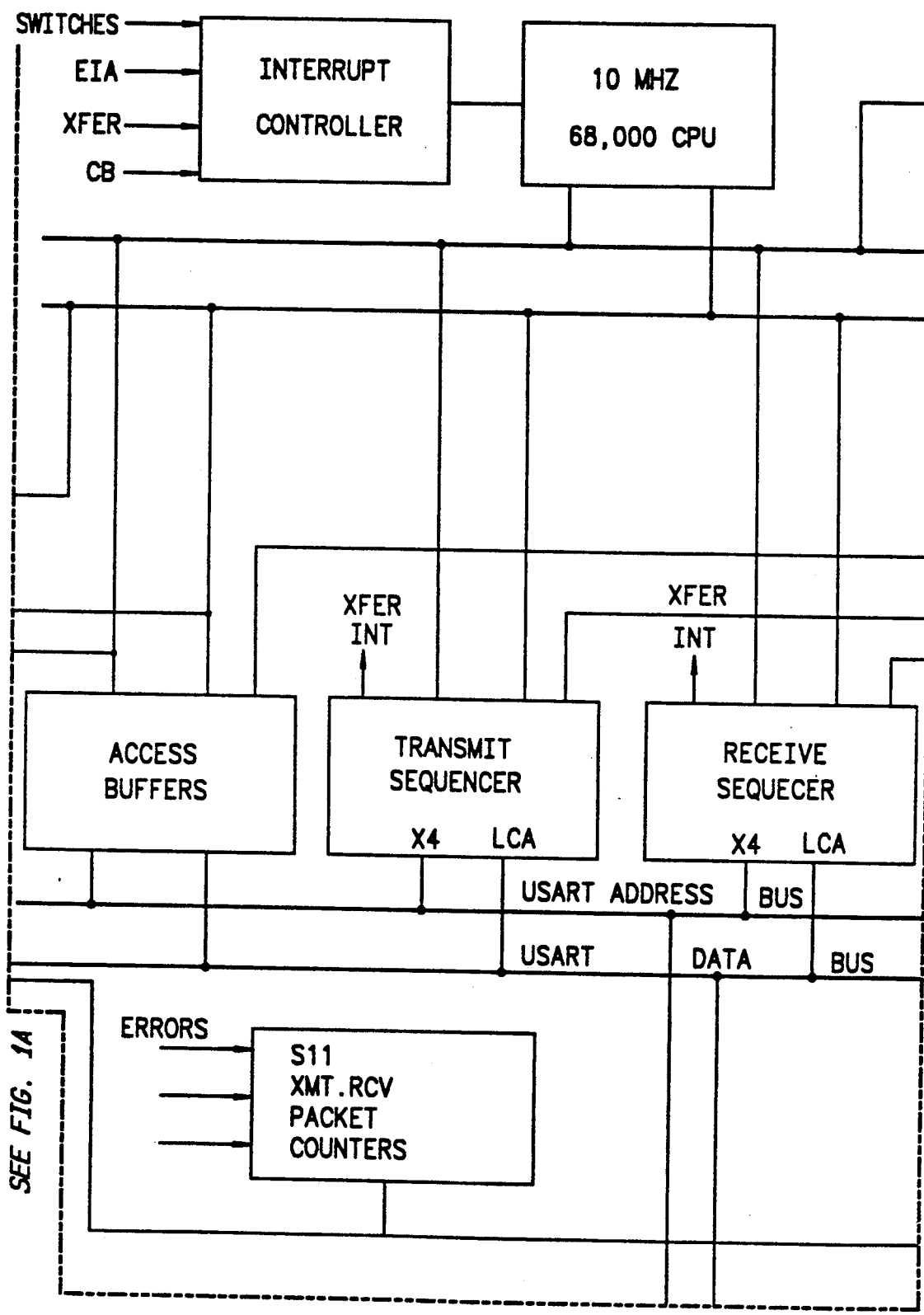
Figure 1D:
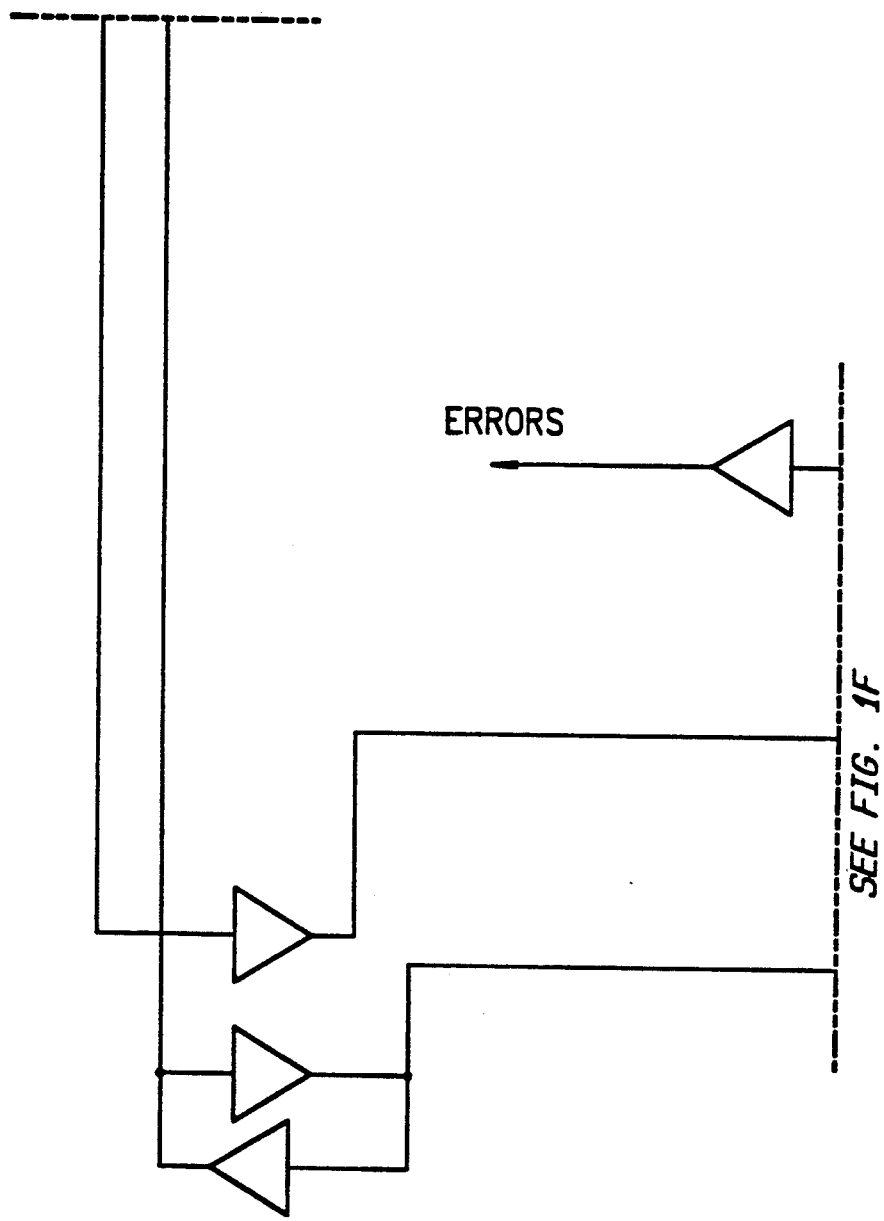
Figure 1E:
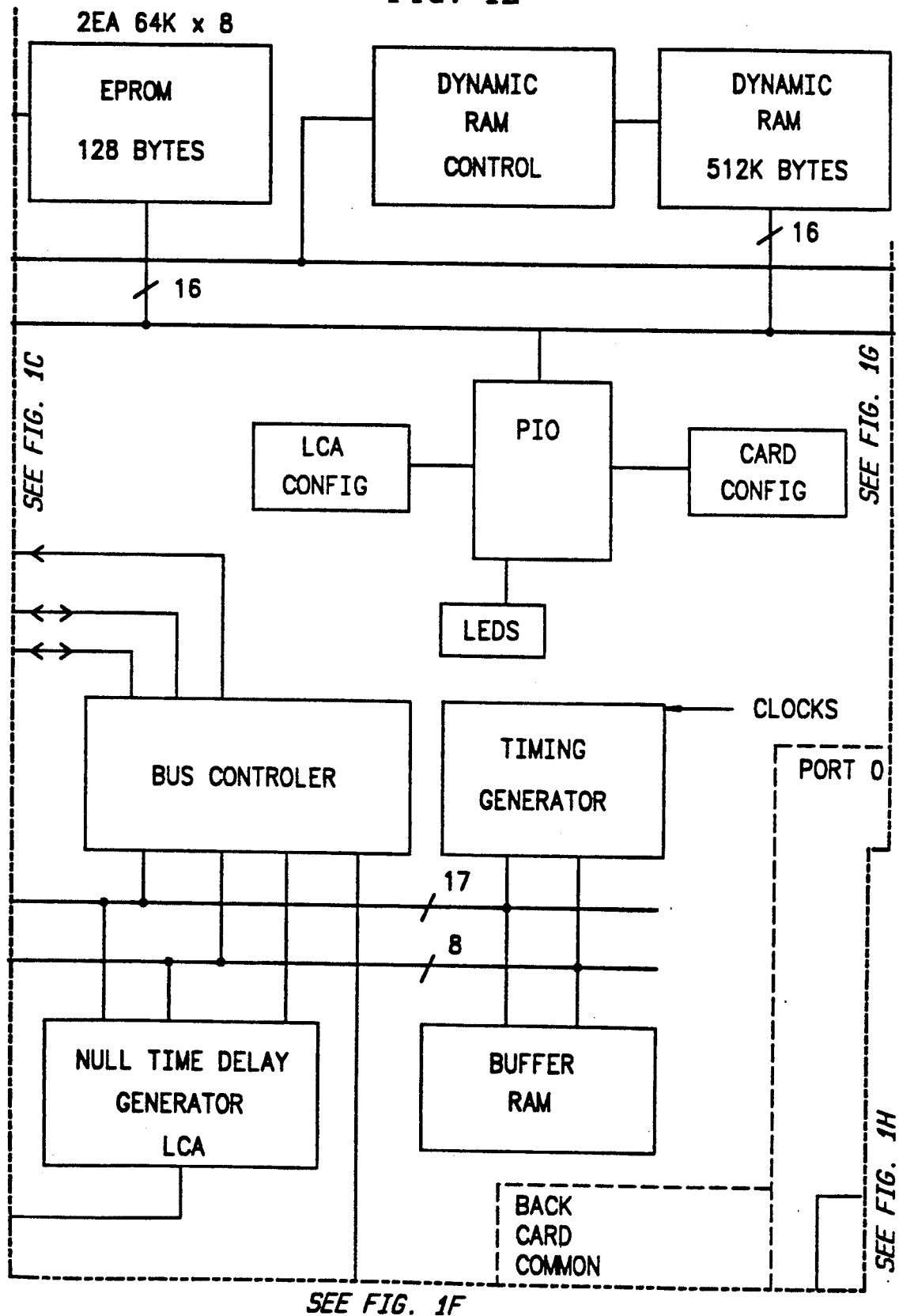
Figure 1F:
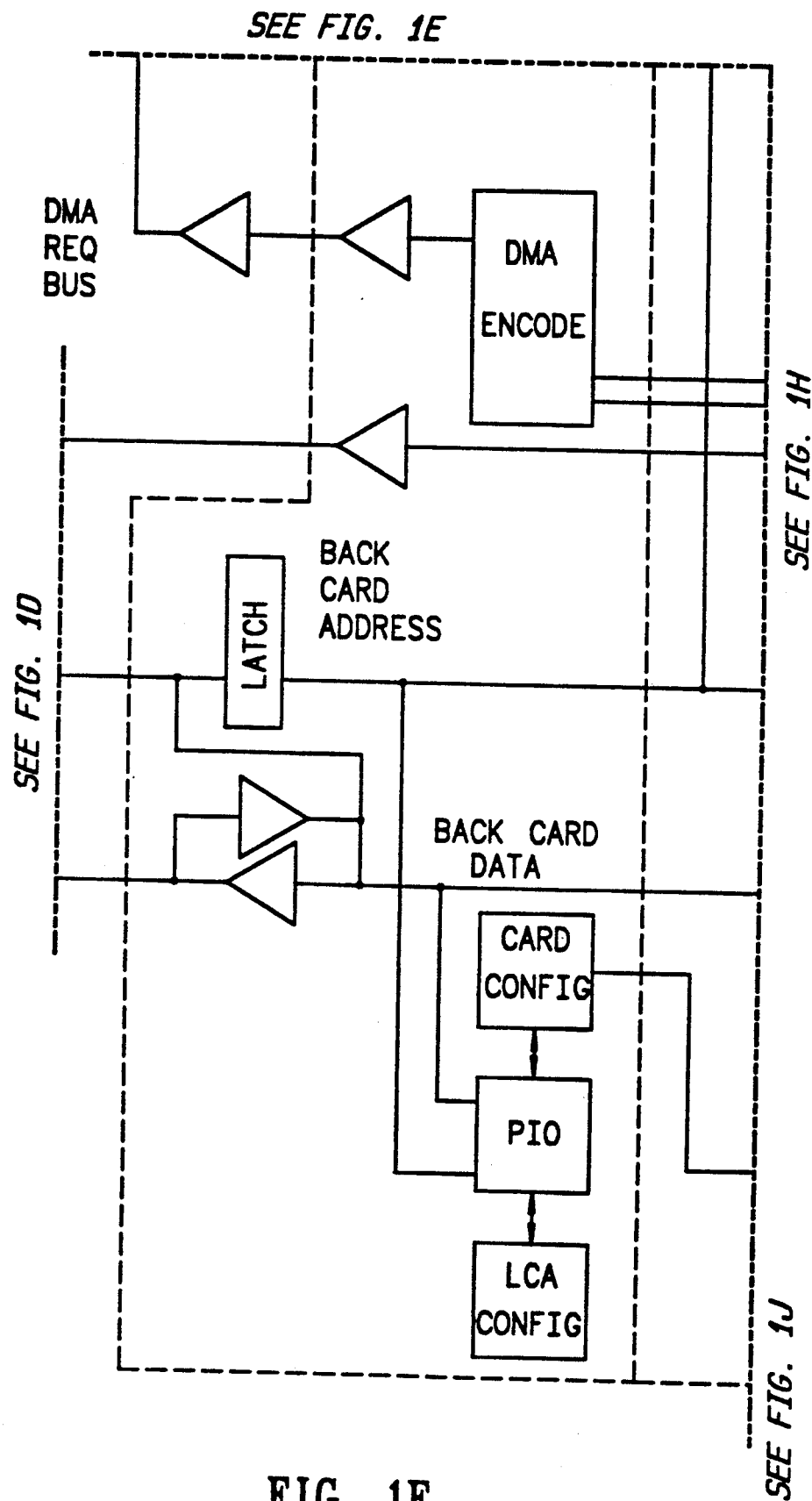
Figure 1G:
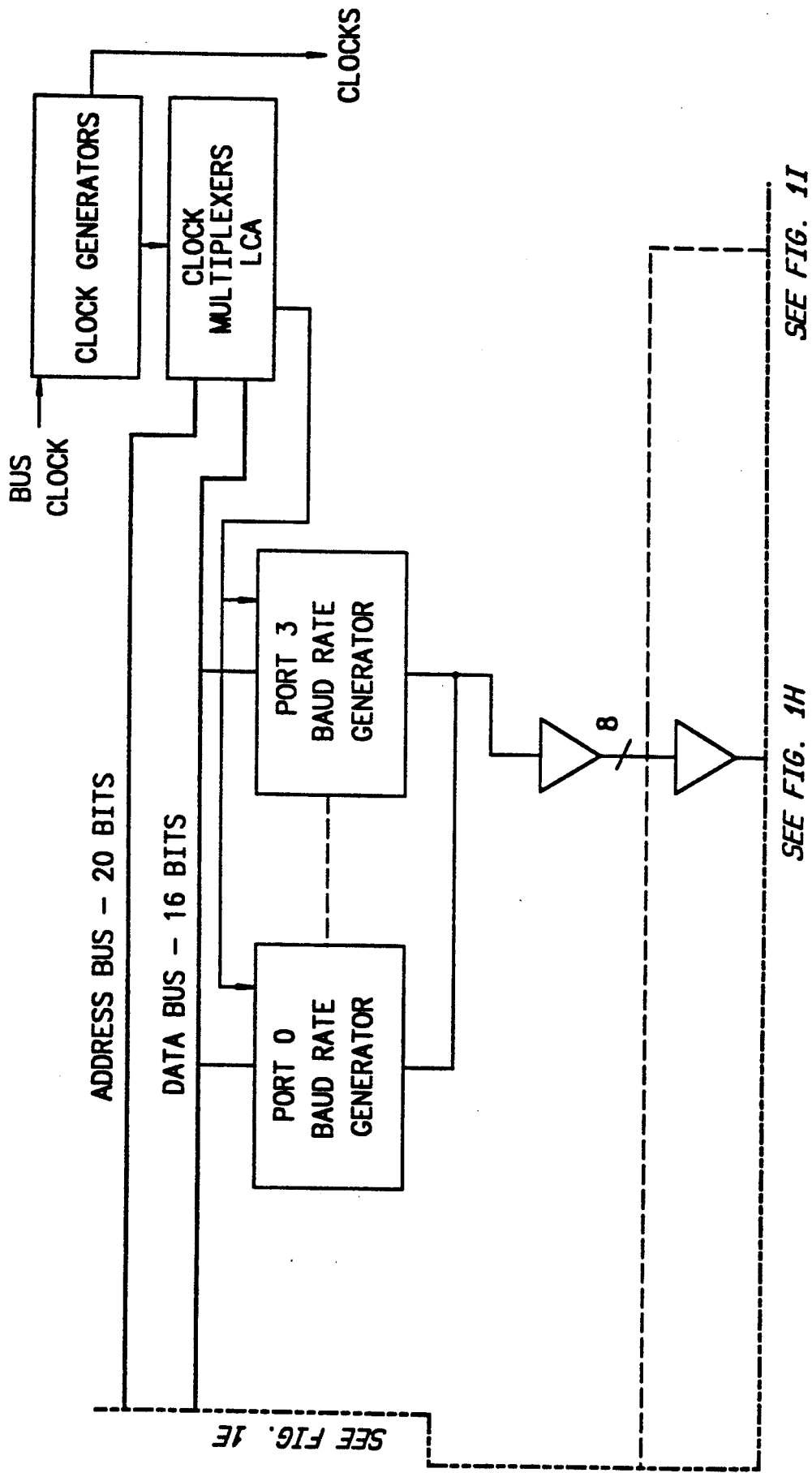
Figure 1H:
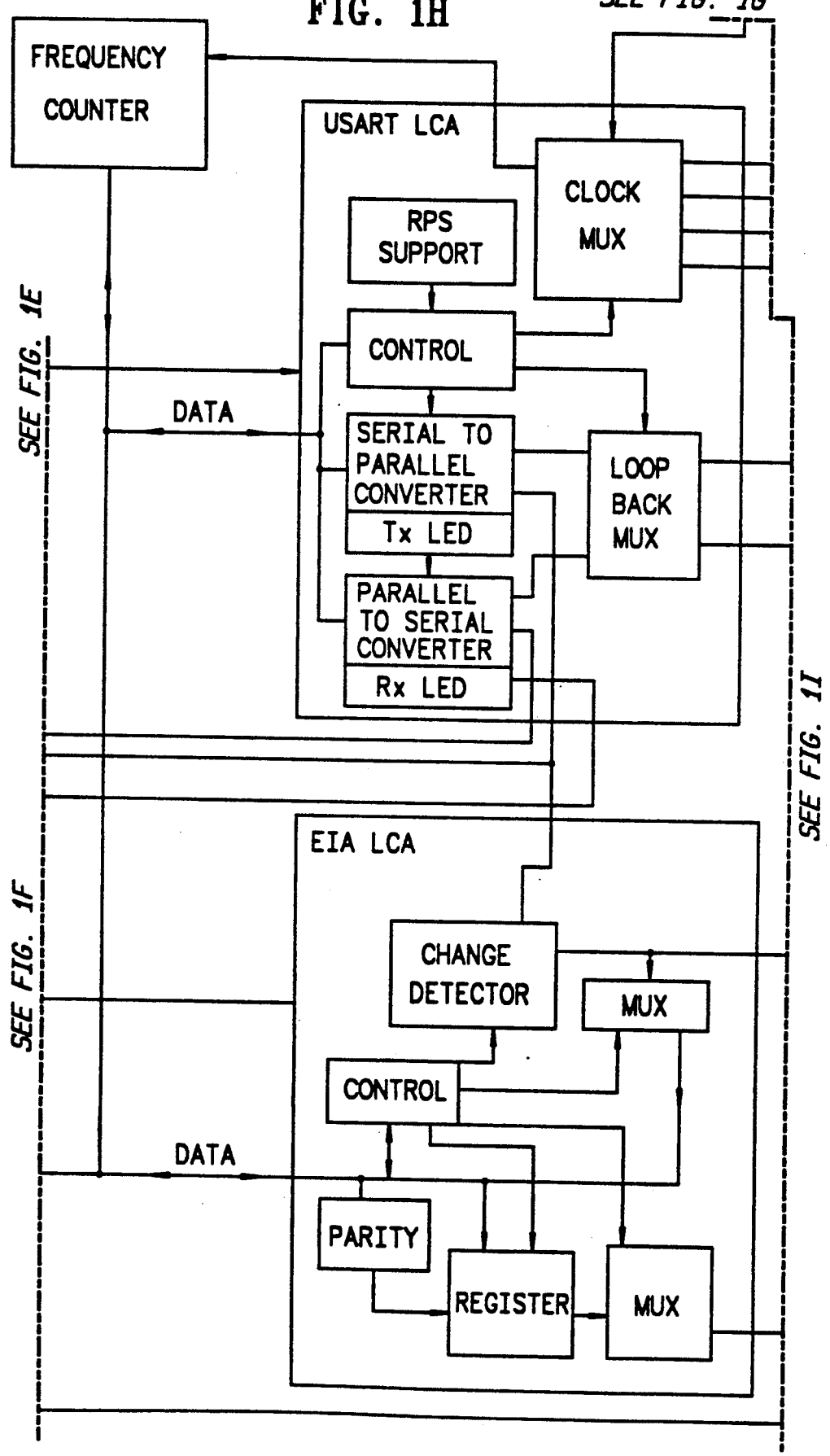
Figure 1I:
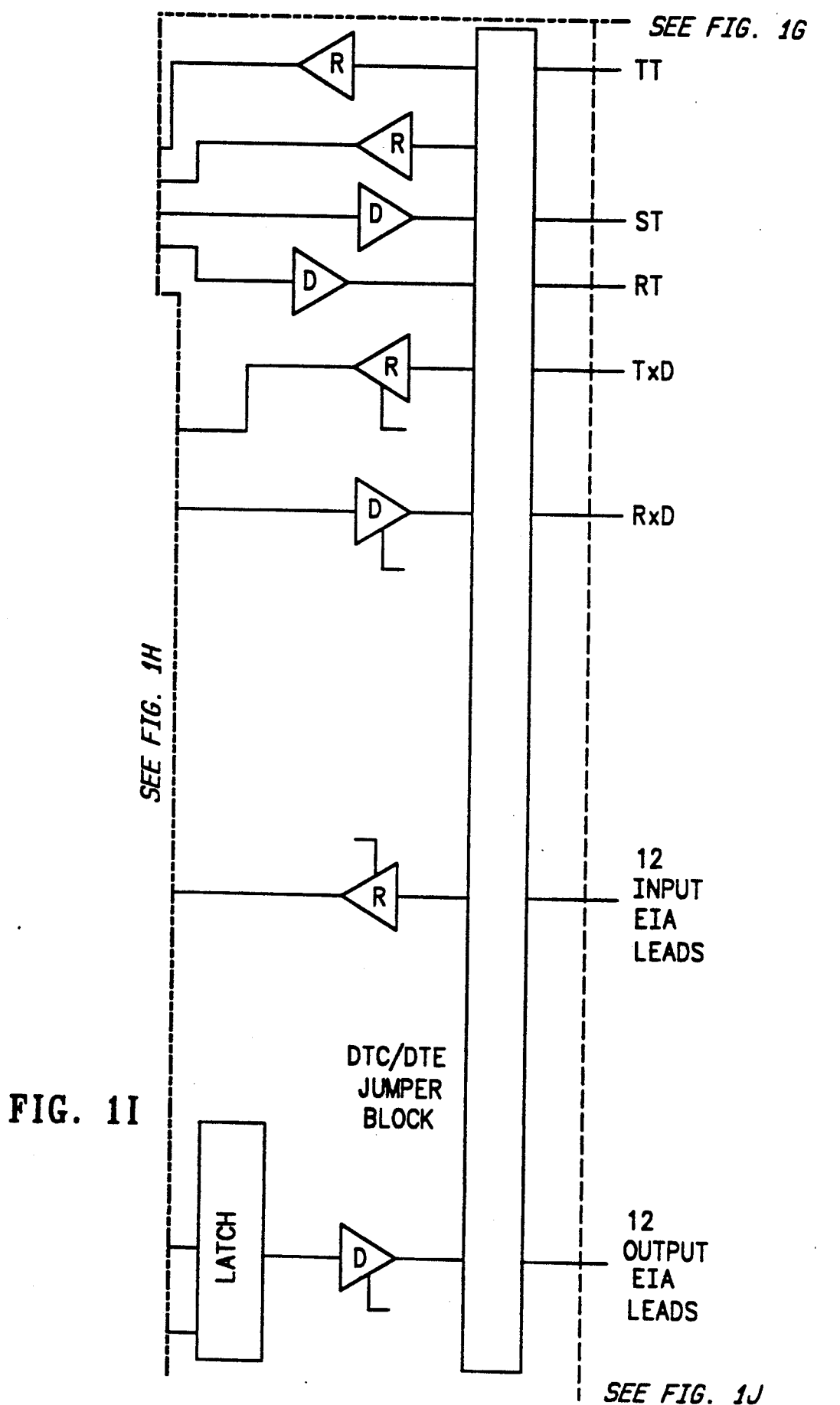

With RPS active on a data connection, the same receive and transmit paths are traversed as in the "Normal" data transfer case. However, the sequencer bus LCA's functions are more complicated.

Referring to FIGS. 1A-1J, the USART LCA (Logic Cell Array) has the responsibility for the bit pattern match functions in both the compression and expansion stages. There is a USART LCA status bit that is monitored by the XMIT Sequencer LCA to indicate if a pattern match condition exists on the user input stream.

If the XMIT LCA loads a complete packet under this condition, then it declares RPS to be active on the channel. The XMIT LCA is the actual point where packets are suppressed on the SDP and where the decision is made to send a sixteenth (or "heartbeat") packet.

As packets are presented to the RCV Sequencer LCA from the mux bus, their internal sequence numbers are used to select which "slot" in a circular "packet" buffer they should be stored in. When a particular buffer is loaded from the bus, a flag is set to indicate that "a packet has been received."

The RCV sequencer clears this flag whenever it plays out the valid packet. If it checks this flag and a packet has not been received for this slot, it tells the USART LCA to "fill in" the missing bits. The USART LCA uses its internal pattern bits when an outgoing match condition exists, or a MARK HOLD value for any other case.

Repetitive Pattern Suppression

The general operational description of how the RPS technique works on the SDP is presented above. In this section, implementation details are presented for the compression and expansion portions of the algorithm. Also included are applications information, flow charts and state machine descriptions, error conditions and error recovery cases for the technique.

Optimizing Line Compression

When establishing an RPS data connection, a user can optionally select a search pattern size of 7 or 8 bits. This value defaults to an 8-bit pattern. Although the algorithm itself is protocol independent, the amount of compression achieved for a given protocol will vary based on whether a 7- or 8-bit pattern search is applied. Some protocols idle at all "1"s, so that any pattern length will compress.

A 7-bit search pattern is recommended for use in two specific cases: The first application is any 7-bit ASCII based synchronous protocol. Here the line uses a 7-bit "idle" character (0×16 or 0010110 binary). The second is whenever an SDLC based protocol is observed to have flag characters (i.e., 01111110 binary) "sharing zero bits." This condition actually generates a 7-bit repeating "idle" pattern on the communications line (i.e., 011111101111110... binary). Most SDLC applications have two separate zero bits per flag (0111111001111110... binary). However, other multi-bit searches are possible.

RPS Algorithm descriptions

RPS Transmit Details

The compression side of the RPS technique continuously monitors the incoming user data stream for the situation where a 7- (or 8-) bit pattern occurs at the end of a packet and then recurs throughout the following packet. When the first complete packet of repeating patterns is buffered for transmission, RPS conserves bandwidth by throwing it away. As long as the SDP loads packets containing this identical repeating pattern, it suppresses transmission of 15 out of 16 of these consecutive packets. The 16th packet needs to be sent for error recovery purposes.

Note that if the RPS pattern size and the SDP data encoding size are not the same, then later pattern matches can occur across packet boundaries. For example, when using 8-bit data encoding, an established 7-bit RPS pattern must precess through multiple packets for them to be suppressed (one boundary match might have three bits matching in one packet and four bits in the next). If at any time the incoming user data changes patterns, then the SDP sends packets as usual.

A list of the algorithm steps that an SDP applies at the compression end (TRANSMITTING from a user interface to the MUX bus) of an RPS IPX connection are described as follows:

| STATE NAME | STATE DESCRIPTION |
|---|---|
| TX STARTUP | A user selectable pattern size of 7, 8 or 16 bits is chosen prior to establishing the data connection. This is independent of and should not be confused with the 7 or 8 bit data encoding option for the circuit. Although the algorithm itself is protocol independent, the amount of compression achieved on a given connection will vary based on whether a 7-, 8- or 16-bit pattern search is applied. Let the chosen pattern length be referred to as an "N" below for generality. Also, depending on whether the connection is Time stamped or non-Time stamped, the number of samples per packet are either 19 or 20, respectively. Initially, the algorithm is in the PATTERN HUNT state. |
| PATTERN HUNT | As data bits are shifted in from the user interface, they are continuously compared (on a bit by bit basis) to the previous N bits of the input stream. The previous N bits are effectively our "rolling input pattern space." When the first incoming sample matches all N bits of the pattern, the REPEAT PATTERN state is acquired. |
| REPEAT PATTERN | Next, the algorithm must fill a complete packet while in the REPEAT PATTERN state before the SUPPRESS PACKET state is valid. Note that for this state to be active for the duration of a packet, the last sample in the previous packet has to match every sample in the present one. If the packet does not contain a repeating pattern, then we return to the PATTERN HUNT state. |
| SUPPRESS PACKET | As long as a match condition exists, the system stays in this state for no more than fifteen consecutive packets. While in this state, packets continue to be buffered, but NO packets are transmitted. After the fifteenth packet has been suppressed, the system jumps to the RPS HEARTBEAT state. Any time a mismatch occurs the system returns to the PATTERN HUNT state. |
| RPS HEARTBEAT | The sixteenth consecutive packet (whenever the previous fifteen packets have been suppressed) is sent to maintain sequence number synchronization between SDPs. After sending this packet, and as long as the matching condition exists, the next state is SUPPRESS PACKET. Any time a mismatch occurs, the system returns to the PATTERN HUNT state. |

Figure 2:
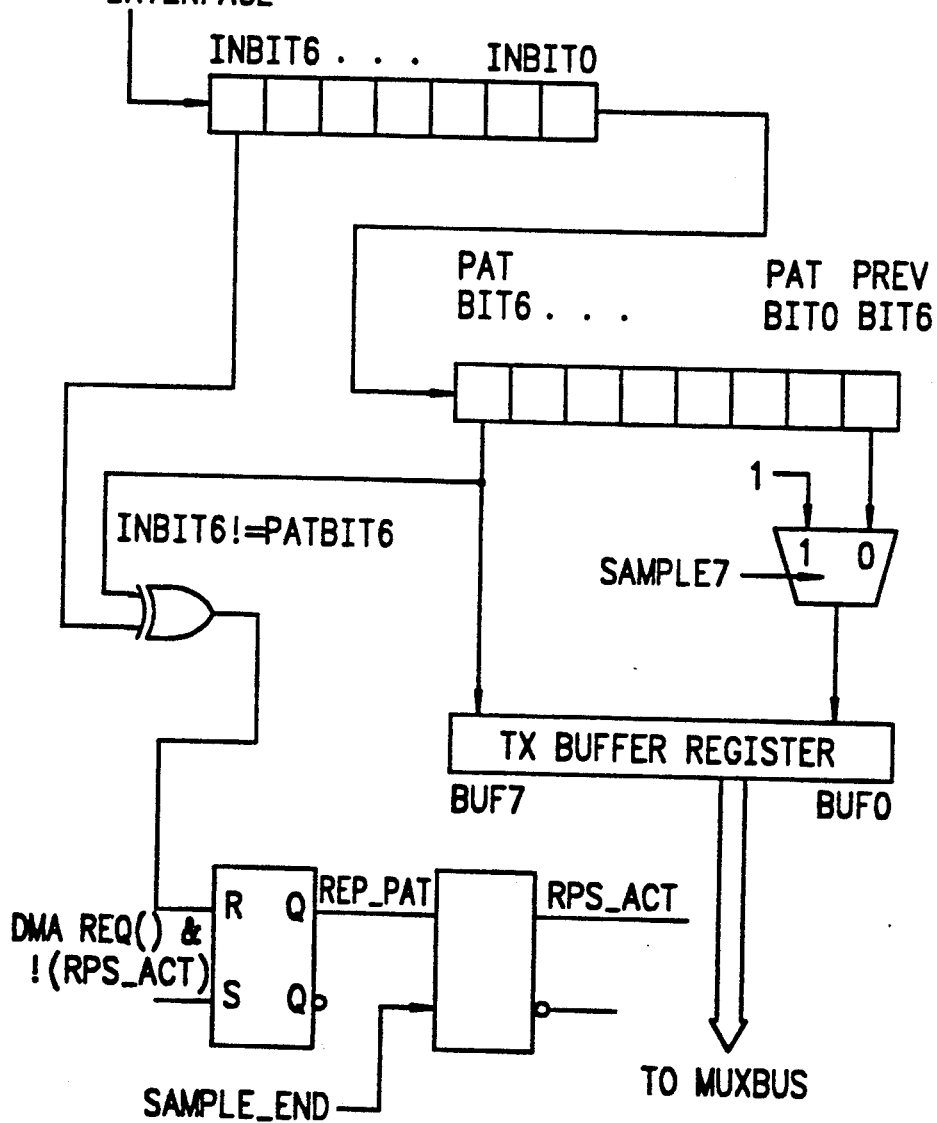
FIG. 2 depicts an RPS compression logic diagram according to the present invention.
Figure 3:
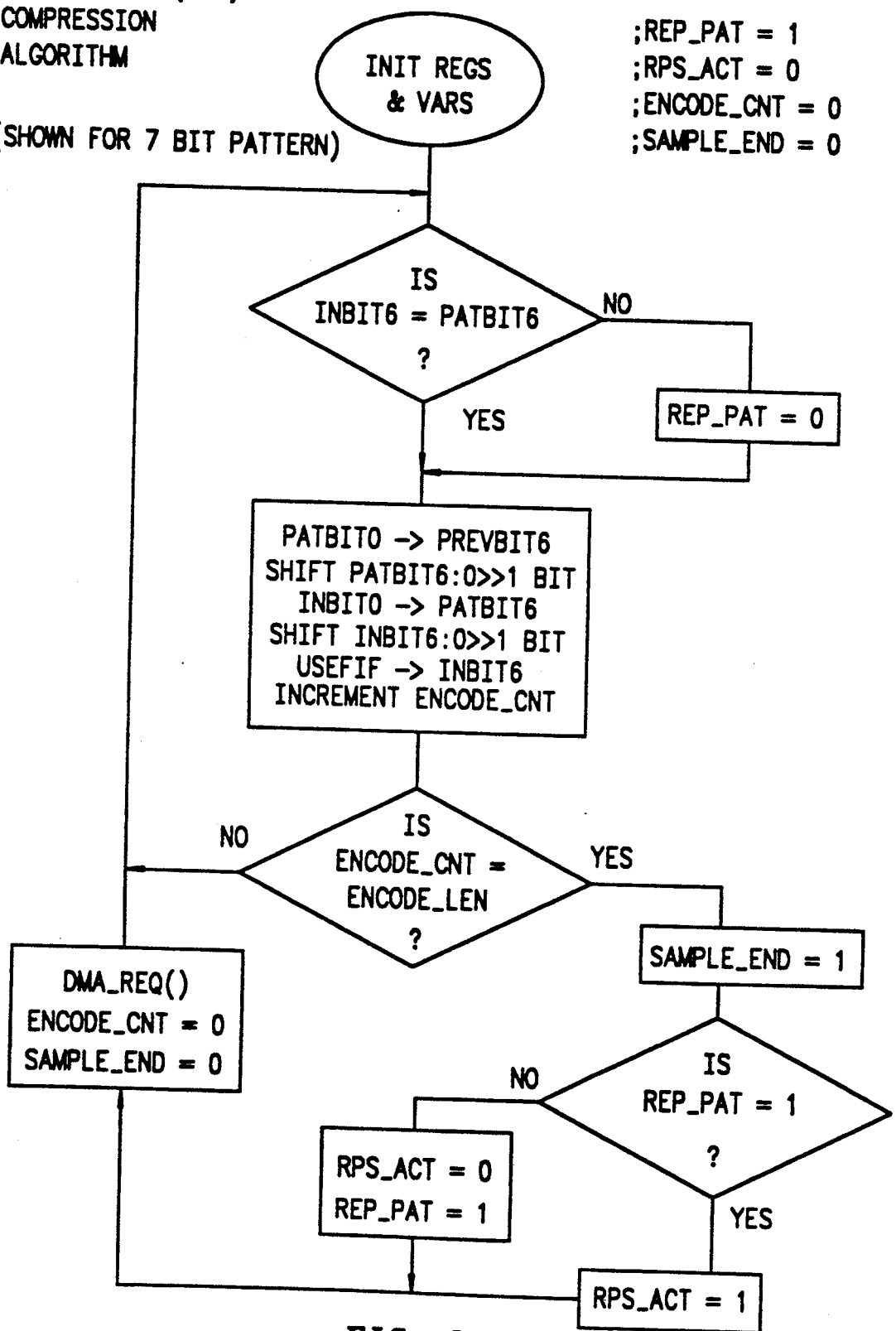
FIG. 3 depicts an RPS compression algorithm according to the present invention.

A generic logic diagram for the RPS input portion of the USART LCA is shown in FIG. 2. A flow chart documenting the pattern processing portion of the RPS compression algorithm is attached in FIG. 3. FIG. 7 shows the RPS technique according to the present invention. References to the generic logic diagram appear throughout this flowchart.

RPS Receive Details

The expansion part of the RPS algorithm has the responsibility for recreating the outgoing user data stream when packets are dropped. It also has the job of maintaining the correct amount of propagation delay for the data connection. The hardware on the SDP that initially sets the correct delay value is the Null Time Delay LCA. The RCV sequencer LCA restarts the Null Time Delay whenever it detects that the circular packet queue input and output pointers are not being maintained properly by the flow of packets.

Buffer underrun and overrun are severe cases where these pointers are scrambled. Because RPS is supported for isochronous clocking connections, overruns can occur during transient clocking overspeeds. They can also happen whenever a user supplied data output clock disappears. Underruns can be caused by dropped packets during any type of connection. The absence of a user supplied data input clock is another source of underruns.

A list of the algorithm steps that an SDP applies at the expansion end (RECEIVING from the Mux bus to a user interface) of an RPS IPX connection are described as follows:

| STATE NAME | STATE DESCRIPTION |
|---|---|
| RX STARTUP | The same factors are involved here as in the TX STARTUP state; sample size and samples per packet. Both ends of an RPS connection must have the same RPS pattern size values selected. Initially, the algorithm is in the FILL PAT HUNT state. |
| FILL PAT HUNT | As valid packet data bits are received from the mux bus receiver buffer, they are played out normally. As bits are presented to the user interface, the last N bits of the stream are shifted out through a "pattern register." During the FILL PAT HUNT state, a "No Packet Received" (when expected) condition causes a transition to the EXPAND PACKET state. When an RX Buffer Overrun or RX Buffer Underrun condition takes place, the next state is the MARK HOLD state. |
| EXPAND PACKET | When the algorithm ends up running out of samples due to a No Packet Received condition, it takes bits from the "output fill pattern register," sends them to the user and recirculates the register. Receipt of a valid data packet causes a return to the FILL PAT HUNT state. If an RX Buffer Overrun or RX Buffer Underrun condition takes place here, the next state is the MARK HOLD state. |

Figure 4:
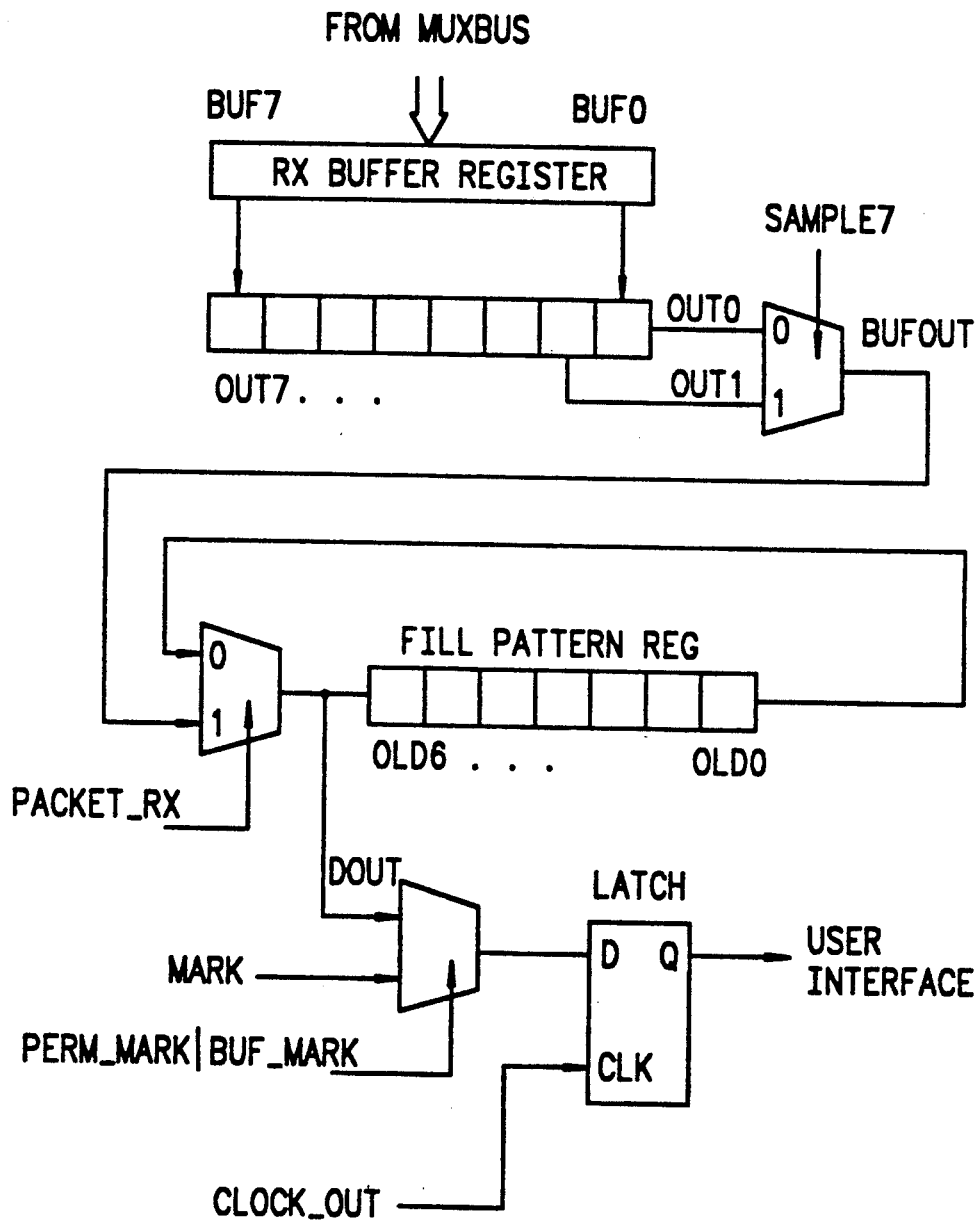
FIG. 4 depicts an RPS expansion block diagram according to the present invention.
Figure 5:
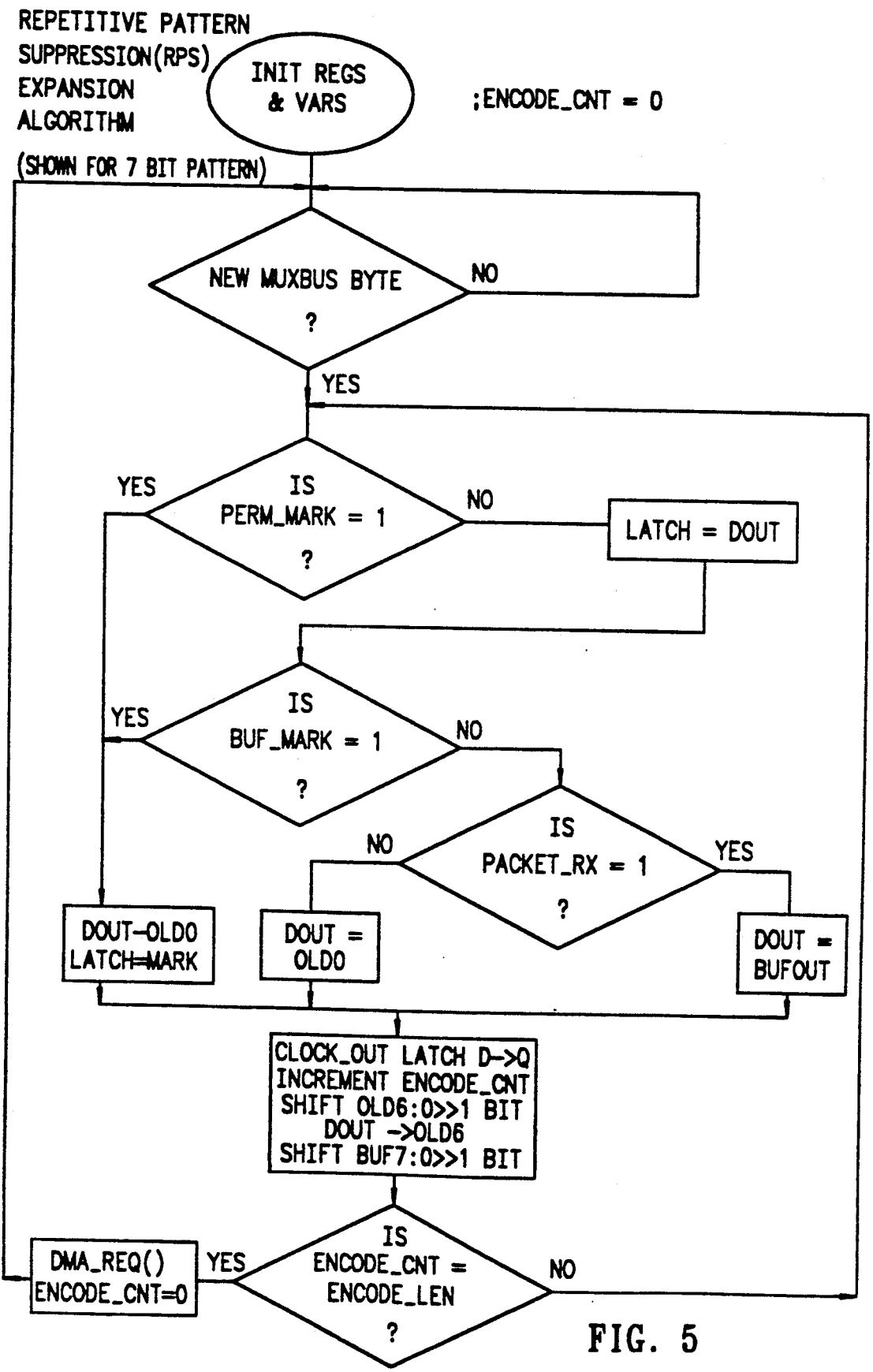
FIG. 5 depicts an RPS expansion algorithm according to the present invention.

A generic logic diagram for the RPS output portion of the USART LCA is shown in FIG. 4. A flowchart documenting the pattern processing portion of the RPS expansion algorithm is attached in FIG. 5. References to the generic logic diagram appear throughout this flowchart.

Error Conditions

In the real world of T1 transmission of packetized data, bit errors are unavoidable. There can be two generic effects from line errors in the IPX system: corrupted packet headers and corrupted user data. In either event, the higher levels of any data transfer protocol in nearly every case will detect the error and force a retransmission of the data. The RPS algorithm has five possible responses to these error conditions. Four deal with dropped packets and one relates to a very specific user data error case.

To add some perspective to the situations below, when a packet drop occurs in the non-RPS SDP transfer mode, the "hole" in the data stream is closed up by concatenating the next packet received to the end of the last one played out. This shifts the bit stream out of relative time sequence temporarily until the receiving end can catch up.

Because RPS is based on the controlled absence of packets to effect bandwidth conservation, a dropped packet error has very well defined results. Essentially, the expansion side of the algorithm kicks into action and fills the "hole" with repeated copies of the last byte of the last packet it received. Thus, the relative time sequence of the bits is preserved end to end in RPS mode.

Dropped Packet Errors

FIG. 6 shows the diagrams representing the possible error cases. The first four are the dropped packet cases and their erroneous results. Note that the probability for a dropped packet on a T1 line with a 10E-6 error rate is 2.4*10E-5, or the sum of the probability of error for each of the 24 bits in the header. The actual probability for each of these first four cases would be related to the fraction of the T1 consumed by the data connection times the probability of the described packet sequence on the line. This would be at least three orders of magnitude smaller for a 9600 baud connection with a 50% line utilization.

| CASE 1: | Here there is a line coming out of a pattern suppression state and the first non-repeating data packet is dropped. This is a relatively benign situation, where most likely the line would stay "idle" during the dropped packet period. |
|---|---|
| CASE 2: | This case displays one of RPS's most vulnerable points. If an input line condition shifts from one suppressed pattern to another DIFFERENT pattern in the space of one packet AND that packet is somehow lost, then RPS faithfully plays out the previous (wrong) pattern. The algorithm recovers from this as soon as another packet is received. The worst case line error expansion when this happens can occur for no more than 17 packets' worth of data because of the "heartbeat" packet transmission. |
| CASE 3: | In this situation, we have RPS mistaking a dropped packet for a suppressed one. The fill pattern for the missing packet is derived from whatever sample pattern lands at the end of the previous packet. |
| CASE 4: | Again, one of RPS's vulnerable points. If the input line condition is shifting from random data to the pattern suppression state AND the transition packet is somehow lost, then RPS plays out the wrong pattern. The worst case line error expansion when this happens can occur for no more than 17 packets worth of data because of the "heartbeat" packet transmission. |

Suppressed Packet with Previous Data Error

The last diagram in FIG. 6 shows the data error expansion case and its erroneous results. Case 5 is the least probable of all the cases because it requires an error in the last byte of the previous packet. For a 10E-6 error rate line, the probability of an error in the last byte is 8*10E-6. Note that the actual probability of this case is one-third less likely to occur, statistically, as any of the previous four (a bit error in any of the three header bytes can cause a packet drop, whereas the user data error must happen in exactly the last byte of the packet to cause this case.

| CASE 5: | This situation is essentially a variant on Case 4. If the input line condition is shifting from random data to the pattern suppression |
|---|---|

-continued

> state AND the transition packet has the last sample corrupted, then RPS plays out the wrong pattern. The worst case line error expansion when this happens can occur for no more than 17 packets worth of data because of the "heartbeat" packet transmission.

In all of the above error cases, the resulting conditions are transient and should not seriously degrade data line performance, because of the infrequency of occurrence.

The present invention provides a repetitive pattern packet suppression technique which is protocol independent and which is believed applicable to all types of digital transmission facilities. Asynchronous, binary synchronous and bit synchronous are supported with no impact on host or terminal software.

What is claimed is:

1. A package voice/data communication system comprising
   means for transmitting data packets in a data bit stream from a first location to one or more second locations over a multi-time slot digital facility,
   means for queuing said data packets along with voice packets,
   compression means at said first location for determining whether said data stream has one or more data packets filled with repetitive patterns of configurable length, said compression means including means for suppressing said data packets such that the suppressed data packets are not transmitted to said second locations,
   means at said first location for controlling the impact of bit errors and dropped packets by sending a packet if a certain number of consecutive data packets have been suppressed,
   expansion means at said second location for replicating said repetitive patterns into the portion of said data stream which corresponds to the suppressed data packets.

2. The system as in claim 1 wherein said compression means and said expansion means are protocol independent.

3. A packet voice/data system as in claim 1 wherein said compression means allow overloads of voice packets and data packets to be handled separately.

4. In a packet voice/data communication system, the method comprising the steps of
   transmitting data packets in a data stream from a first location to one or more second locations over a multi-time slot digital facility,
   queuing said data packets along with voice packets,
   determining at said first location whether said data stream has one or more data packets filled with repetitive patterns of configurable length,
   suppressing repetitive ones of said packets such that the suppressed packets are not transmitted to said second locations, and
   replicating at said second locations said repetitive patterns into the portion of said data stream which corresponds to the suppressed packets.

5. A packet voice/data communication system as in claim 2 wherein the data packets have a user selected pattern size and wherein said system includes means for continuously comparing in a pattern hunt state the pattern sizes on a bit by bit basis of incoming samples such that when the first incoming sample matches all bits of the pattern, a repeat pattern state is acquired.

6. A system as in claim 5 including means for operating in said repeat pattern state such that the last sample in the previous packet matches every sample in the present packet.

7. A system as in claim 6 including means for operating in a suppress packet state such that the system stays in a suppress packet state for no more than a predetermined number of consecutive packets, and after the last packet has been suppressed, the system sends a heartbeat packet to maintain synchronization between said locations and to reduce the impact of bit errors and dropped packets.

8. A system as in claim 7 wherein said system includes means for sending a packet to said second locations after said predetermined number of consecutive packets have been suppressed.

9. A system as in claim 8 wherein each of said second locations includes a pattern register and means for operating in a fill pattern hunt state such that received bits are shifted out through said pattern register.

10. A system as in claim 9 including means for operating in an expand packet state, including means for retrieving bits from said pattern register, and means for recirculating said pattern register.

11. A system as in claim 10 wherein all of the components of the system are implemented as a program in a field programmable gate array.

* * * * *